(12) United States Patent
Ochi

(10) Patent No.: US 7,449,896 B2
(45) Date of Patent: Nov. 11, 2008

(54) CURRENT SENSOR USING LEVEL SHIFT CIRCUIT

(75) Inventor: Sam Seiichiro Ochi, Saratoga, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 11/496,981

(22) Filed: Jul. 31, 2006

(65) Prior Publication Data

US 2007/0024324 A1    Feb. 1, 2007

Related U.S. Application Data

(60) Provisional application No. 60/703,573, filed on Jul. 29, 2005.

(51) Int. Cl.
*G01R 27/08*    (2006.01)
(52) U.S. Cl. ..................................... 324/713
(58) Field of Classification Search .................. 324/713
See application file for complete search history.

(56) References Cited

U.S. PATENT DOCUMENTS 5,765,949 A * 6/1998 Haddad et al. .............. 374/179
6,178,514 B1 * 1/2001 Wood ......................... 713/300
7,102,335 B1 * 9/2006 Solie .......................... 323/273
2005/0073317 A1 * 4/2005 Yamamoto et al. ......... 324/503

* cited by examiner

*Primary Examiner*—Vincent Q. Nguyen
*Assistant Examiner*—Jeff Natalini
(74) *Attorney, Agent, or Firm*—Townsend and Townsend and Crew LLP

(57) ABSTRACT

A circuit for sensing a current includes a first upper resistor having a first end coupled to a first end of a sense resistor, the sense resistor being configured to receive an input current. A second upper resistor has a first end coupled to a second end of the sense resistor, so that the sense resistor defines a first potential between the first and second ends of the sense resistor. A first lower resistor is provided between the first upper resistor and the ground. A second lower resistor is provided between the second upper resistor and the ground. An amplifier has a first input node and a second input node, the first input node being coupled to a node between the first upper resistor and the first lower resistor. The second input node is coupled to a node between the to the second upper resistor and the second lower resistor. The first and second input nodes defines a second potential corresponding to the first potential.

13 Claims, 3 Drawing Sheets

CURRENT SENSOR USING LEVEL SHIFT CIRCUIT

BACKGROUND OF THE INVENTION

The present invention relates to a current sensor using a differential resistor level shift technique.

Current sensors are widely used in various electrical and electronic apparatus to regulate the apparatus. Current transformers and hall devices are common current sensors being used now. The current sensor market is expected to expand greatly in the coming years. This is in part a result of increasing demand for electric automobiles.

Also much effort is being devoted to devising more efficient electrical apparatus that manages its power usage better. For example, if the current sensor indicates that not enough current is being output, a current source can be caused to output more current. Similarly, if too much current is being output, the current source can be caused to output less current. In this way, the apparatus can be made to operate at an optimal level.

FIG. 1 illustrates a typical current sensor that a hall element. The current sensor comprises a magnetic circuit by a C-shaped magnetic core 102 turned around an electric wire 100 and a hall device 104 arranged in the gap of the magnetic core 102.

FIG. 2 illustrates a current sensor that uses a magneto-impedance device whose magnetic permeability changes in response to the external magnetic. The current sensor includes a non-magnetic substrate 140. A magneto-impedance device 142 and a spiral coil 144 are formed on the substrate 140. The opposite ends of the MI device 142 were connected to electrodes 146a and 146b. The magneto-impedance device is formed from a strip of magnetic thin film.

The spiral coil 144 included a left side coil and a right side coil that are connected to each other. The inner end of the left side coil is connected to the electrode 146b, while the inner end of the right side coil is connected to the other electrode 146b. Thus, as the magneto-impedance device 142 is electrically energized, the coil 144 provides an output that can be used to determine the amount of current flow.

The above current sensors are relatively bulky and expensive to manufacture. It would be desirable to provide a current sensor that is less bulky and less expensive to manufacture.

BRIEF SUMMARY OF THE INVENTION

The present invention relates to a current sensor using a differential resistor level shift technique. The present current sensor generally is less bulky and expensive to manufacture than the conventional current sensors. In one implementation, the present current sensor may be provided on a single silicon chip.

In one embodiment, a circuit for sensing a current includes a first upper resistor having a first end coupled to a first end of a sense resistor, the sense resistor being configured to receive an input current. A second upper resistor has a first end coupled to a second end of the sense resistor, so that the sense resistor defines a first potential between the first and second ends of the sense resistor. A first lower resistor is provided between the first upper resistor and the ground. A second lower resistor is provided between the second upper resistor and the ground. An amplifier has a first input node and a second input node, the first input node being coupled to a node between the first upper resistor and the first lower resistor. The second input node is coupled to a node between the to the second upper resistor and the second lower resistor. The first and second input nodes defines a second potential corresponding to the first potential.

In one embodiment, the circuit is provided on a single semiconductor chip. The single semiconductor chip is packaged in plastic to provide a discrete packaged current sensor. The discrete packaged current sensor is configured to handle at least 100 volts, or at least 300 volts. The discrete packaged current sensor is configured to handle at least 10 amperes.

In another embodiment, a current sensor includes a semiconductor substrate. A first upper resistor is defined on the substrate and has a first end coupled to a first end of a sense resistor, the sense resistor being configured to receive an input current. A second upper resistor is defined on the substrate and has a first end coupled to a second end of the sense resistor, so that the sense resistor defines a first potential between the first and second ends of the sense resistor. A first lower resistor is defined on the substrate and provided between the first upper resistor and the ground. A second lower resistor is defined on the substrate and provided between the second upper resistor and the ground. An amplifier is defined on the substrate and has a first input node and a second input node. The first input node is coupled to a node between the first upper resistor and the first lower resistor, and the second input node is coupled to a node between the to the second upper resistor and the second lower resistor. The first and second input nodes defines a second potential corresponding to the first potential.

DETAILED DESCRIPTION OF THE INVENTION

The present invention relates to a current sensor using a differential resistor level shift technique. In one embodiment, the current sensor is formed on a single semiconductor chip. The current sensor may be provided as a discrete device or in a module. The discrete device is a packaged device that has a single semiconductor chip. The module is a packaged device having two or more chips.

Figure 1:
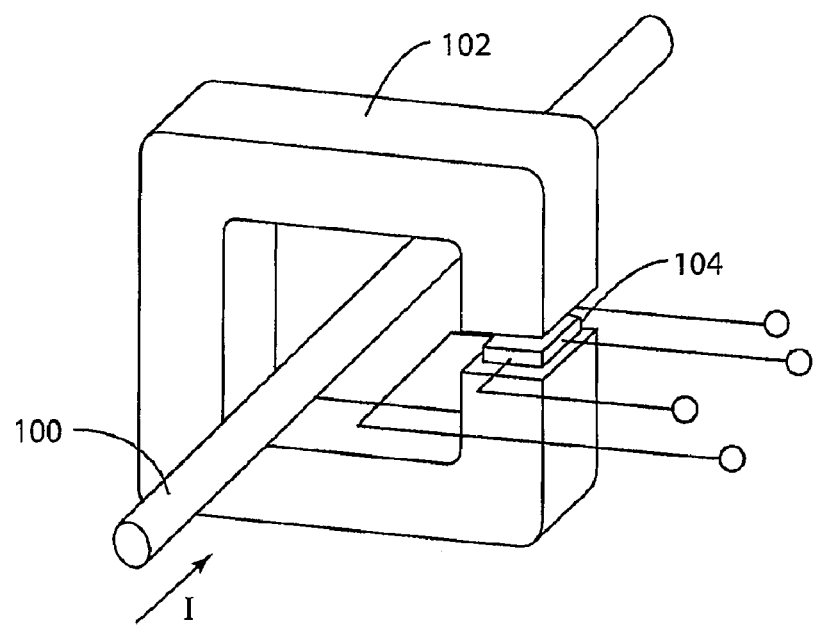
FIG. 1 illustrates a typical current sensor that comprises a magnetic circuit by a C-shaped magnetic core turned around an electric wire and a hall device arranged in the gap of the magnetic core.
Figure 2:
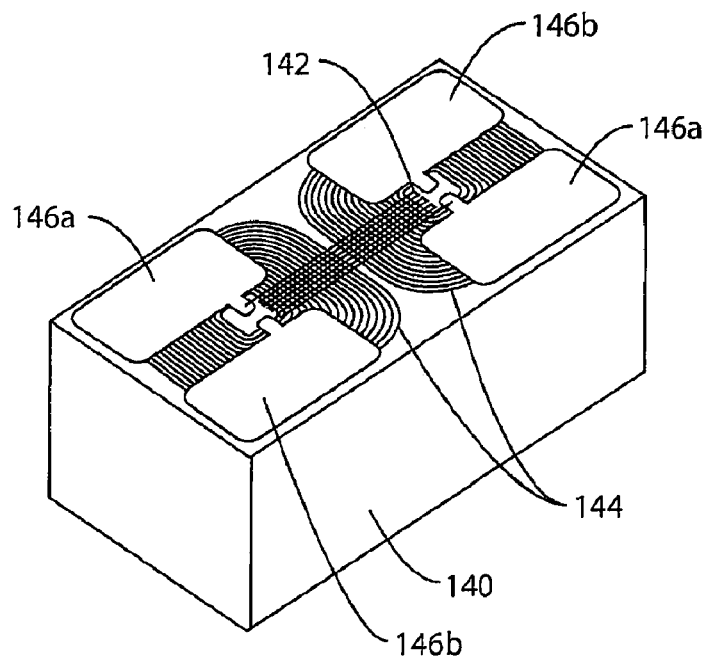
FIG. 2 illustrates a current sensor that uses a magneto-impedance device whose magnetic permeability changes in response to the external magnetic.
Figure 3:
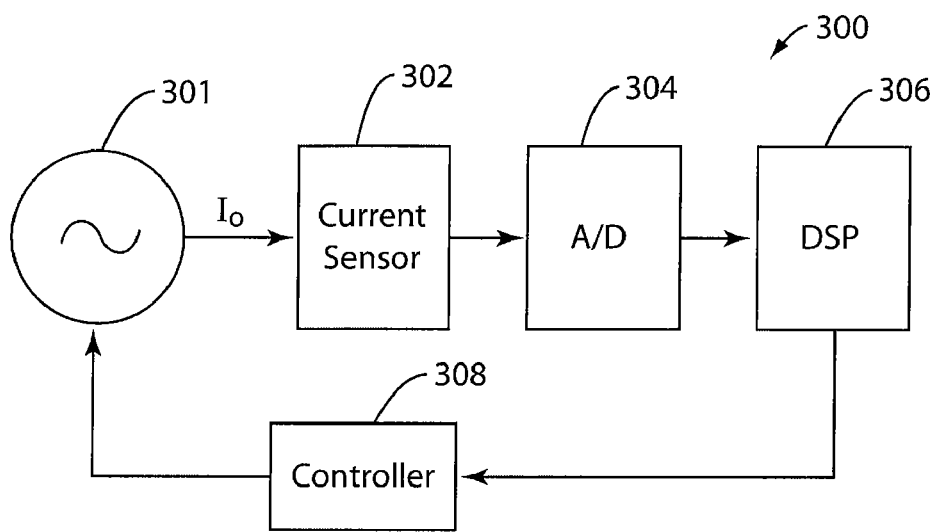
FIG. 3 illustrates an electrical apparatus wherein a current sensor may be used.

FIG. 3 illustrates an electrical apparatus 300 wherein a current sensor 302 may be used. A motor 301 outputs a current Io to the current sensor 302. The output current Io is sensed by the current sensor. The result is sent to an analog-to-digital (A/D) converter 304. The converted digital information is sent to a digital signal processor (DSP) 306 to determine whether or not the current level is appropriate. The DSP sends a control signal to a controller 308. The controller 308 uses the control signal to control the motor accordingly.

Figure 4:
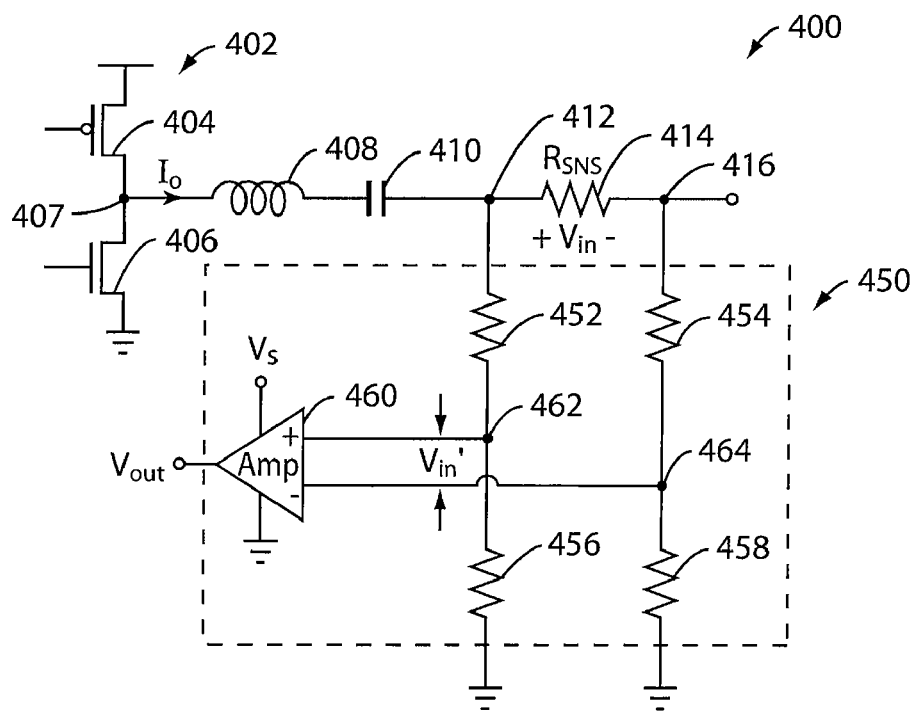
FIG. 4 illustrates a circuit with a current sensor according to one embodiment of the present invention.

FIG. 4 illustrates a circuit 400 with a current sensor 450 according to one embodiment of the present invention. The circuit 400 includes a switch 402 with two power transistors 404 and 406 in a half bridge configuration. The transistor 404 is a PMOSFET, and the transistor 406 is an NMOSFET. An inductor 408 is connected to a node 407 provided between the two transistors. An input current Io flows through the inductor 408 via the node 407. A capacitor 410 is connected in series to the inductor 408. A first end of the capacitor 410 is coupled to the inductor 408 and a second end of the capacitor 410 is coupled to a node 412.

A sense resistor (Rsns) 414 is used to determined the current level. One end of the sense resistor 414 (Rsns) is connected to the node 412, and the other end of the sense resistor 414 is coupled to a node 416. The sense resistor defines an input voltage Vin (or first potential) across it according to the input current Io. In the present implementation, the sense resistor 414 is provided with 0.01 ohm. Sense resistors with different resistive values may be used for other applications.

The current sensor 450 includes first and second upper resistors 452 and 454 that are coupled to the nodes 412 and 416, respectively. In the present embodiment, each of these two resistors is provided with the resistance value of 950K ohms. The two upper resistors are provided with substantially the same resistive value.

The current sensor 450 further includes first and second lower resistors 456 and 458 and an amplifier 460. The lower resistors are provided with 50K ohms each, so that the attenuation is 20:1. The two lower resistors are provided with substantially the same resistive value. The amplifier 460 is an instrumentation amplifier in the present implementation, but may be of a different type in other implementations. The amplifier 460 refers to both the ground and the power supply voltage (Vs). In the present implementation the power supply voltage is 15 volts.

One end of the upper resistor 452 is coupled to the node 412, and the other end of the upper resistor 452 is coupled to a first input node 462 of the amplifier 460. Similarly, one end of the upper resistor 454 is coupled to the node 416, and the other end of the upper resistor 454 is coupled to a second input node 464 of the amplifier 460. The first input node receives a positive input and the second input node receives a negative input. These two inputs define a voltage difference of Vin' (or second potential) that is an attenuated voltage of the input voltage Vin across the sense resistor 414. The amplifier 460 is configured to provide a gain of 1000 in the present implementation.

The lower resistor 456 is connected to and provided between the first input node 462 and the ground. The lower resistor 458 is connected to and provided between the second input node 464 and the ground. Each of these lower resistors is provided with the resistance value of 50K ohms, so that the attenuation is 20:1. In other implementations, the resistors may be provided with other values to provide a different attenuation ratio.

In the present embodiment, the current sensor 450 is implemented on a single semiconductor chip. The sense resistor 414 may be provided external to the chip or on the same chip. The current sensor may be provided as a discrete device or in a module. For example, a packaged device including the current sensor 450 has two or more semiconductor chips.

Referring back to FIG. 4, in operation, the value of the current Io may be determined using the voltage output by the amplifier 460. The output voltage (Vout) of the amplifier is 1000×Vin', where Vin' is Vin/attenuation. Since the attenuation is 20 in the present implementation, the output voltage Vout is 50×Vin. The Vin is Io×Rsns, where Rsns is 0.01. Therefore, Vout is 0.5×Io. Accordingly, if Vout is determined to be 5 volts, it is determined that the current Io is 10 amperes.

Figure 5:
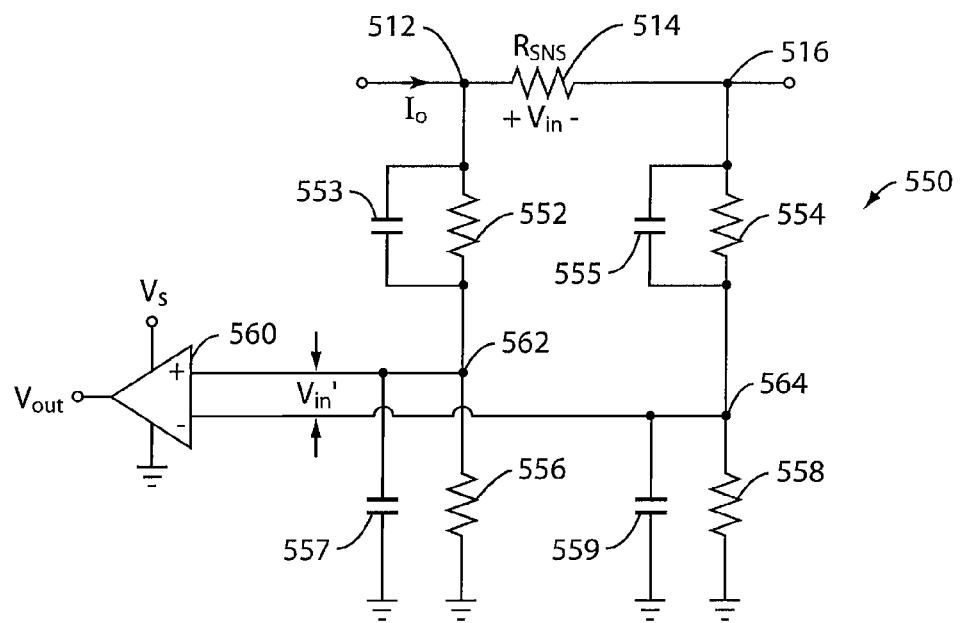
FIG. 5 illustrates a current sensor that uses a level shift technique according to another embodiment of the present invention.

FIG. 5 illustrates a current sensor 550 that uses a level shift technique according to another embodiment of the present invention. The current sensor 550 is provided with a plurality of capacitors to remove the RC effects on the signals, thereby providing sharper edges to the signals. The current sensor 550 includes first and second upper resistors 552 and 554 that are coupled to the nodes 512 and 516, respectively. A sense resistor 514 is provided between the nodes 512 and 516. In the present embodiment, each of these two resistors is provided with the resistance value of 950K ohms, but may be of different values according to application. These two upper resistors are provided with substantially the same resistive value.

The current sensor 550 includes first and second lower resistors 556 and 558 and an amplifier 560. The lower resistors are provided with 50K ohms each, so that the attenuation is 20:1. These two lower resistors are provided with substantially the same resistive value. The amplifier 560 is an instrumentation amplifier but may be of a different type in other applications.

One end of the upper resistor 552 is coupled to the node 512, and the other end of the upper resistor 552 is coupled to a first input node 562 of the amplifier 560. Similarly, one end of the upper resistor 554 is coupled to the node 516, and the other end of the upper resistor 554 is coupled to a second input node 564 of the amplifier 560. The first input node receives a positive input and the second input node receives a negative input. These two inputs define a voltage difference of Vin' that is an attenuated voltage of the input voltage Vin across the sense resistor 514. The amplifier 560 is configured to provide a gain of 1000 in the present implementation. The amplifier 560 refers to both the ground and the power supply voltage (Vs), e.g., 15 volts.

The lower resistor 556 is connected to and provided between the first input node 562 and the ground. The lower resistor 558 is connected to and provided between the second input node 564 and the ground. Each of these lower resistors is provided with the resistance value of 50K ohms. In other implementations, the resistors may be provided with other values to provide a different attenuation value.

A first capacitor 553 is provided in parallel to the upper resistor 552. A second capacitor 555 is provided in parallel to the upper resistor 554. Each of the capacitors 553 and 555 is provided with 1 picofarad or pF. A third capacitor 557 is provided in parallel to the lower resistor 556. For example, the third capacitor 557 is provided between the node 562 and ground. A fourth capacitor 559 is provided in parallel to the lower resistor 558. For example, the fourth capacitor 559 is provided between the node 564 and ground. Each of the capacitors 557 and 559 is provided with 19 pF, so that the attenuation of 20:1 is maintained. These four capacitors counters the RC effects on the signals to make them have sharper edges.

Figure 6A:
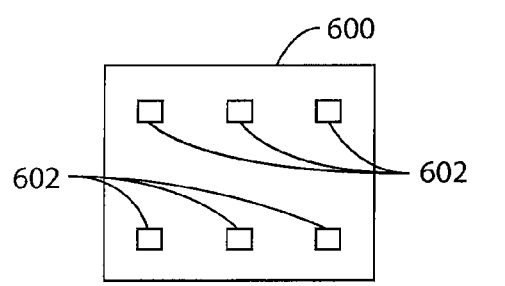
FIG. 6A illustrates a semiconductor chip or substrate whereon a current sensor is defined according to one embodiment of the present invention.
Figure 6B:
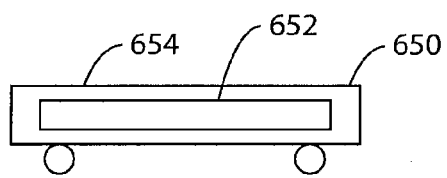
FIG. 6B illustrates a packaged semiconductor device with a current sensor according to one embodiment of the present invention.

FIG. 6A illustrates a semiconductor chip or substrate 600 whereon a current sensor (not shown) is defined according to one embodiment of the present invention. The chip 600 includes a plurality of contacts pads 602. FIG. 6B illustrates a packaged semiconductor device 650 according to one embodiment of the present invention. The packaged device 650 includes a semiconductor chip or substrate 652 and a plastic housing 654. A current sensor (not shown) is defined on the chip or substrate. The packaged device 650 may be a discrete device having a single semiconductor chip or a module having a plurality of chips.

The above detailed descriptions are provided to illustrate specific embodiments of the present invention and are not intended to be limiting. Numerous modifications and variations within the scope of the present invention are possible. Accordingly, the present invention is defined by the appended claims.

What is claimed is:

1. A circuit for sensing a current, the circuit comprising:
a first upper resistor having a first end coupled to a first end of a sense resistor, the sense resistor being configured to receive an input current;
a second upper resistor having a first end coupled to a second end of the sense resistor, so that the sense resistor defines a first potential between the first and second ends of the sense resistor;
a first lower resistor provided between the first upper resistor and the ground;
a second lower resistor provided between the second upper resistor and the ground;
a first capacitor provided in parallel to the first upper resistor;
a second capacitor provided in parallel to the second upper resistor;
a third capacitor provided between a power source and a node connected to the first upper resistor and the sense resistor;
an amplifier having a first input node and a second input node, the first input node being coupled to a node between the first upper resistor and the first lower resistor, the second input node being coupled to a node between the second upper resistor and the second lower resistor, the first and second input nodes defining a second potential corresponding to the first potential;
a fourth capacitor provided between the first input node of the amplifier and the ground;
a fifth capacitor provided between the second input node of the amplifier and the ground; and
wherein the circuit is enclosed within a single package.

2. The circuit of claim 1, wherein the first and second upper resistors have substantially the same resistive value, and the first and second lower resistors have substantially the same resistive value.

3. The circuit of claim 2, wherein the first and second upper resistors and the first and second lower resistors are configured to provide a given attenuation, so that the second potential is the first potential that is attenuated by a given ratio.

4. The circuit of claim 1, wherein the amplifier is an instrumentation amplifier.

5. The circuit of claim 1, wherein the circuit is provided on a single semiconductor chip.

6. The circuit of claim 5, wherein the single semiconductor chip is packaged in plastic to provide a discrete packaged current sensor.

7. The circuit of claim 6, wherein the discrete packaged current sensor is rated to handle the input current of 100 volts or more.

8. The circuit of claim 6, wherein the discrete packaged current sensor is configured to handle the input current of at least 10 amperes.

9. A current sensor, comprising:
a semiconductor substrate;
a first upper resistor defined on the substrate and having a first end coupled to a first end of a sense resistor, the sense resistor being configured to receive an input current;
a second upper resistor defined on the substrate and having a first end coupled to a second end of the sense resistor, so that the sense resistor defines a first potential between the first and second ends of the sense resistor;
a first lower resistor defined on the substrate and provided between the first upper resistor and the ground;
a second lower resistor defined on the substrate and provided between the second upper resistor and the ground;
a first capacitor provided in parallel to the first upper resistor;
a second capacitor provided in parallel to the second upper resistor;
a third capacitor provided between a power source and a node connected to the first upper resistor and the sense resistor;
an amplifier defined on the substrate and having a first input node and a second input node, the first input node being coupled to a node between the first upper resistor and the first lower resistor, the second input node being coupled to a node between the second upper resistor and the second lower resistor, the first and second input nodes defining a second potential corresponding to the first potential;
a fourth capacitor provided between the first input node of the amplifier and the ground; and
a fifth capacitor provided between the second input node of the amplifier and the ground.

10. The circuit of claim 9, wherein the semiconductor substrate is packaged in plastic to provide a discrete packaged current sensor.

11. The circuit of claim 10, wherein the discrete packaged current sensor is rated to handle the input current of 100 volts or more.

12. The circuit of claim 10, wherein the discrete packaged current sensor is rated to handle the input current of 300 volts or more.

13. The circuit of claim 10, wherein the discrete packaged current sensor is configured to handle the input current of at least 10 amperes.

* * * * *